United States Patent
Yun et al.

(10) Patent No.: US 10,577,717 B2
(45) Date of Patent: Mar. 3, 2020

(54) SYSTEMS FOR SELECTIVELY FEEDING CHUNK POLYSILICON OR GRANULAR POLYSILICON IN A CRYSTAL GROWTH CHAMBER

(71) Applicant: GlobalWafers Co., Ltd., Hsinchu (TW)

(72) Inventors: Seok Min Yun, Cheonan-si (KR); Seong Su Park, Cheonan-si (KR); Jun Hwan Ji, Cheonan (KR); Won-Jin Choi, Cheonan-si (KR); UiSung Jung, Cheonan (KR); Young Jung Lee, Cheonan-si (KR); Tae Su Koo, Cheonan-si (KR); Sung-Jin Kim, Yongin (KR)

(73) Assignee: GLOBALWAFERS CO., LTD. (TW)

( * ) Notice: Subject to any disclaimer, the term of this patent is extended or adjusted under 35 U.S.C. 154(b) by 0 days.

(21) Appl. No.: 16/352,033

(22) Filed: Mar. 13, 2019

(65) Prior Publication Data
US 2019/0211469 A1    Jul. 11, 2019

Related U.S. Application Data

(63) Continuation of application No. 15/753,428, filed as application No. PCT/US2016/047575 on Aug. 18, 2016, now Pat. No. 10,273,596.

(Continued)

(51) Int. Cl.
| | | |
|---|---|---|
| C30B 15/02 | (2006.01) | |
| C30B 29/06 | (2006.01) | |
| C30B 15/20 | (2006.01) | |
| C30B 15/32 | (2006.01) | |
| C30B 30/04 | (2006.01) | |
| C30B 35/00 | (2006.01) | |
| B64G 1/58  | (2006.01) | |
| B64G 1/64  | (2006.01) | |
| B66D 1/12  | (2006.01) | |

(Continued)

(52) U.S. Cl.
CPC ............ C30B 15/02 (2013.01); B64G 1/58 (2013.01); B64G 1/648 (2013.01); B66D 1/12 (2013.01); C30B 15/20 (2013.01); C30B 15/32 (2013.01); C30B 29/06 (2013.01); C30B 30/04 (2013.01); C30B 35/005 (2013.01); G01S 11/02 (2013.01); G01S 19/13 (2013.01); B64G 1/10 (2013.01); B64G 2001/1092 (2013.01); G01P 15/18 (2013.01)

(58) Field of Classification Search
CPC combination set(s) only.
See application file for complete search history.

(56) References Cited

U.S. PATENT DOCUMENTS

| | | |
|---|---|---|
| 5,580,171 A | 12/1996 | Lim et al. |
| 5,588,339 A | 12/1996 | Dulger |

(Continued)

FOREIGN PATENT DOCUMENTS

| | | |
|---|---|---|
| EP | 1553214 A2 | 7/2005 |
| JP | H01177275 U | 12/1989 |
| KR | 101209185 B1 | 12/2012 |

*Primary Examiner* — Erin F Bergner
(74) *Attorney, Agent, or Firm* — Armstrong Teasdale LLP

(57) ABSTRACT

A feed assembly supplies polysilicon to a growth chamber for growing a crystal ingot from a melt. An example system includes a housing having support rails for receiving one of a granular tray and a chunk tray and a feed material reservoir positioned above the support rails to selectively feed one of either the granular tray or the chunk tray. A valve mechanism and pulse vibrator are also disclosed.

7 Claims, 9 Drawing Sheets

Related U.S. Application Data

(60) Provisional application No. 62/207,773, filed on Aug. 20, 2015.

(51) Int. Cl.
*G01S 11/02* (2010.01)
*G01S 19/13* (2010.01)
*B64G 1/10* (2006.01)
*G01P 15/18* (2013.01)

(56) References Cited

U.S. PATENT DOCUMENTS

| | | |
|---|---|---|
| 5,690,733 A | 11/1997 | Nagai et al. |
| 5,868,835 A | 2/1999 | Nagai et al. |
| 5,919,303 A | 7/1999 | Holder |
| 2004/0035960 A1 | 2/2004 | Arvidson et al. |
| 2004/0211358 A1 | 10/2004 | Fickett et al. |
| 2013/0098290 A1 | 4/2013 | Luter et al. |
| 2016/0060787 A1 | 3/2016 | Park |

SYSTEMS FOR SELECTIVELY FEEDING CHUNK POLYSILICON OR GRANULAR POLYSILICON IN A CRYSTAL GROWTH CHAMBER

CROSS-REFERENCE TO RELATED APPLICATIONS

This application is a continuation of U.S. patent application Ser. No. 15/753,428, filed Feb. 19, 2018, which is the § 371 national stage of International Application No. PCT/US2016/047575, filed on Aug. 18, 2016, which claims priority to U.S. Provisional Patent Application Ser. No. 62/207,773 filed on Aug. 20, 2015 each of which is incorporated herein by reference in its entirety.

FIELD

This disclosure relates generally to semiconductor crystal growth using the Czochralski method and more particularly to supplying stock material such as chunk or granular polysilicon to a crucible melt.

BACKGROUND

In the production of silicon crystals grown by the continuous Czochralski method, polycrystalline silicon is melted within a crucible of a crystal pulling device to form a silicon melt. A seed crystal is then lowered to the melt and slowly raised back up. As the seed crystal is continuously grown from the melt, solid polysilicon such as granular polysilicon is added to the melt to replenish the melt. The feed rate of the additional solid polysilicon added to the melt is typically controlled to maintain process parameters. In the production of silicon crystals grown by the batch Czochralski method, solid polysilicon, such as chunk polysilicon, is not added to the melt while the seed crystal is grown but is added between sequential growing processes. The feed rate of the additional polysilicon is controlled to maintain process parameters.

The solid polysilicon added to the crucible melt is typically granular polysilicon, and it is fed into the crucible using a polysilicon feeder that is optimized for use with granular polysilicon. In some cases, solid polysilicon added to a crucible melt is chunk polysilicon. Chunk polysilicon has a greater size (e.g., in at least one dimension) than that of granular polysilicon. Chunk polysilicon is fed into a crucible using a polysilicon feeder optimized for use with chunk polysilicon. A more satisfactory apparatus and method for feeding either chunk or granular polysilicon is needed.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

An aspect is directed to a feed assembly for supplying polysilicon to a growth chamber for growing a crystal ingot from a melt. The feed assembly includes a housing having support rails for receiving one of a granular tray and a chunk tray. The feed assembly also includes a feed material reservoir positioned above the support rails to selectively feed from one of either the granular tray or the chunk tray.

According to another aspect, a valve mechanism controls the flow of polysilicon from a granular tray of a polysilicon feed assembly to a growth chamber for growing a crystal ingot from a melt. The valve mechanism includes a seal that selectively obstructs an exit of the granular tray. A driver is configured to raise and lower the seal between a sealed position obstructing the exit and an open position in which the seal does not obstruct the exit. A linkage connects the seal to the driver. The seal is shaped to permit a gap between the seal and a portion of the exit of the granular tray such that granular polysilicon within the exit does not prevent a seal between the seal and the exit.

According to another aspect, a magnetic pulse vibrator controls the flow of polysilicon from one of either a granular tray or a chunk tray of a polysilicon feed assembly to a growth chamber for growing a crystal ingot from a melt. The magnetic pulse vibrator includes an electromagnetic energy source that vibrates one of either the granular tray or the chunk tray through the emission of electromagnetic energy. The magnetic pulse vibrator also includes a controller that controls a feed rate of one of either the granular tray or the chunk tray through control of the voltage supplied to the electromagnetic energy source.

According to a further aspect, an interchangeable granular tray, for a feed assembly for supplying polysilicon to a growth chamber for growing a crystal ingot from a melt, includes an exterior portion. The exterior portion removably receives a support rail of the feed assembly. The interchangeable granular tray further includes an interior profile that receives granular polysilicon from a feed material reservoir of the feed assembly. The granular tray is removable from the feed system.

According to another aspect, an interchangeable chunk tray, for a feed assembly for supplying polysilicon to a growth chamber for growing a crystal ingot from a melt, includes an exterior portion. The exterior portion removably receives a support rail of the feed assembly. The interchangeable chunk tray further includes an interior profile that receives chunk polysilicon from a feed material reservoir of the feed assembly. The chunk tray is removable from the feed system.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION

Figure 1:
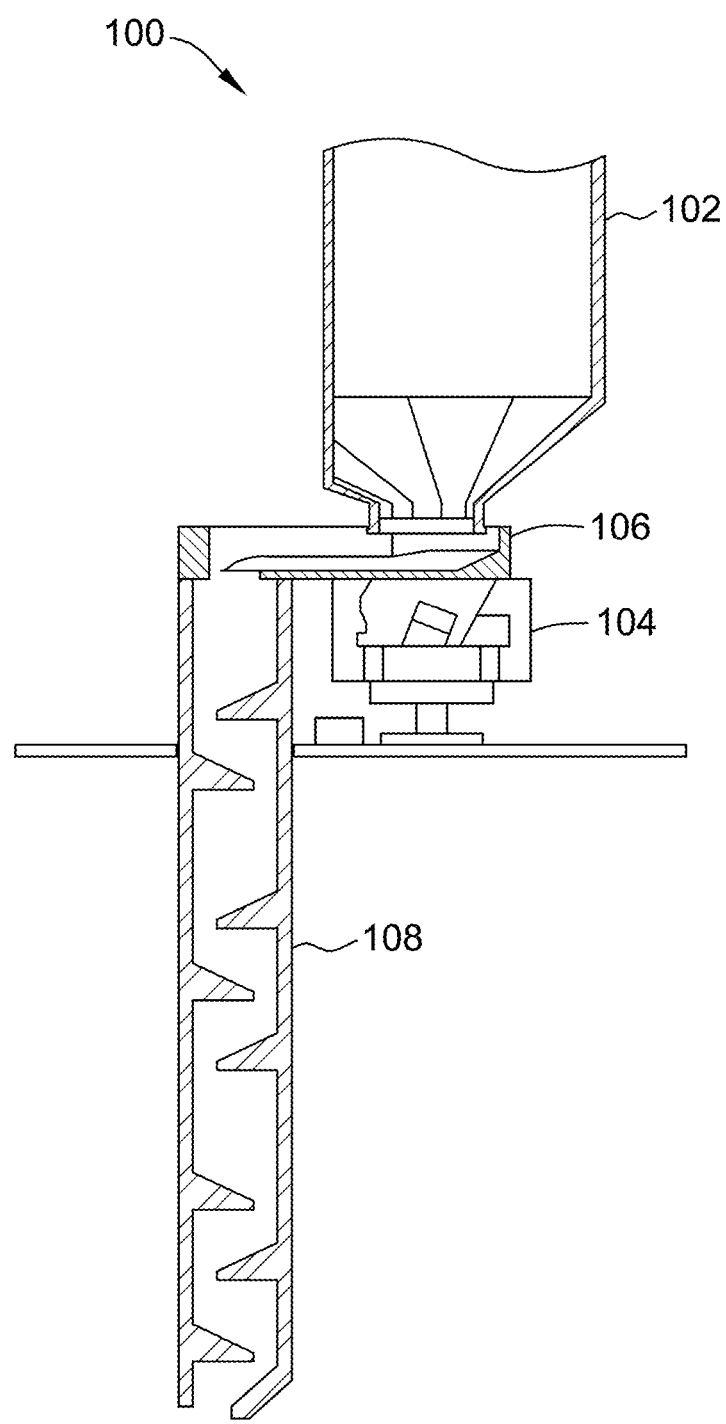
FIG. 1 is a sectional view of a polysilicon feeder with some details omitted for clarity.

Referring now to FIG. 1, a polysilicon feeder 100 of one embodiment includes a hopper 102, an interchangeable tray 106, a vibrator 104, and a guide tube 108. Hopper 102 is configured to receive polysilicon to be supplied to one or more crucibles in a growth chamber (not shown). Note that any type of crucible and growth chamber may be used consistent with this disclosure. Hopper 102 is configured to receive granular polysilicon or chunk polysilicon. Chunk polysilicon typically has a size of between 3 and 45 millimeters (e.g., the largest dimension), and granular polysilicon typically has a size between 400 and 1400 microns. Hopper 102 feeds polysilicon into interchangeable tray 106.

Interchangeable tray 106 may be either a granular tray 300 (shown in FIG. 3A) for use with granular polysilicon loaded in hopper 102 or a chunk tray 400 (shown in FIG. 4A) for use with chunk polysilicon loaded in hopper 102. Interchangeable tray 106 receives polysilicon from hopper 102 and provides polysilicon to guide tube 108 when driven by vibrator 104.

Using interchangeable tray 106 allows polysilicon feeder 100 to be quickly and easily adapted for use with either granular polysilicon or chunk polysilicon. Interchangeable tray 106 may be removed and replaced with a second interchangeable tray that is configured for use with a different type of polysilicon. For example, a granular tray 300 may have features such as a shallow depth relative to that of a chunk tray 400, a funnel portion, a substantially vertical exit portion, or other features suitable for use with granular polysilicon. A chunk tray 400 may have features such as a greater depth than that of the granular tray 300, sloped sides, a slopping exit, or other features suitable for use with chunk polysilicon. Switching one type of interchangeable tray 106 for another converts polysilicon feeder 100 for use with a different type of polysilicon. For example, removing a granular tray 300 and replacing it with a chunk tray 400 converts polysilicon feeder 100 from a feeder to be used with granular polysilicon to a feeder to be used with chunk polysilicon. Interchangeable trays 106, including granular trays 300 and chunk trays 400, are described in greater detail with reference to FIGS. 3A-4C.

Polysilicon feeder 100 includes a vibrator 104 that causes interchangeable tray 106 to vibrate. Vibrator 104 is a magnetic pulse vibrator that vibrates interchangeable tray 106 using magnetic pulses. The magnetic pulse vibrator is discussed in greater detail with reference to FIGS. 2 and 8. Alternatively, vibrator 104 is an electromechanical or mechanical vibrator. For example, vibrator 104 may be or include a reciprocating piston, driven three or four bar mechanism, rotary electric vibrator, or other suitable system for generating vibration.

By vibrating interchangeable tray 106, vibrator 104 causes polysilicon to exit interchangeable tray 106 (e.g., through an exit opposite hopper 102). Polysilicon exiting interchangeable tray 106 enters guide tube 108. By controlling the vibration of vibrator 104, and the vibration of interchangeable tray 106, the feed rate of polysilicon from polysilicon feeder 100 is controlled. A control system (e.g., a programmable logic controller) may control vibrator 104.

Polysilicon feeder 100 also includes a guide tube 108. Guide tube 108 is configured to receive polysilicon that exits interchangeable tray 106 due to vibration caused by vibrator 104. Guide tube 108 directs polysilicon from polysilicon feeder 100 to enter a crucible used in generating a silicon crystal using the Czochralski method. Guide tube 108 may be positioned such that polysilicon is added to a melt within the crucible as a silicon crystal is drawn out of the melt. For example, guide tube 108 may be positioned off center relative to a crystal puller.

Figure 2:
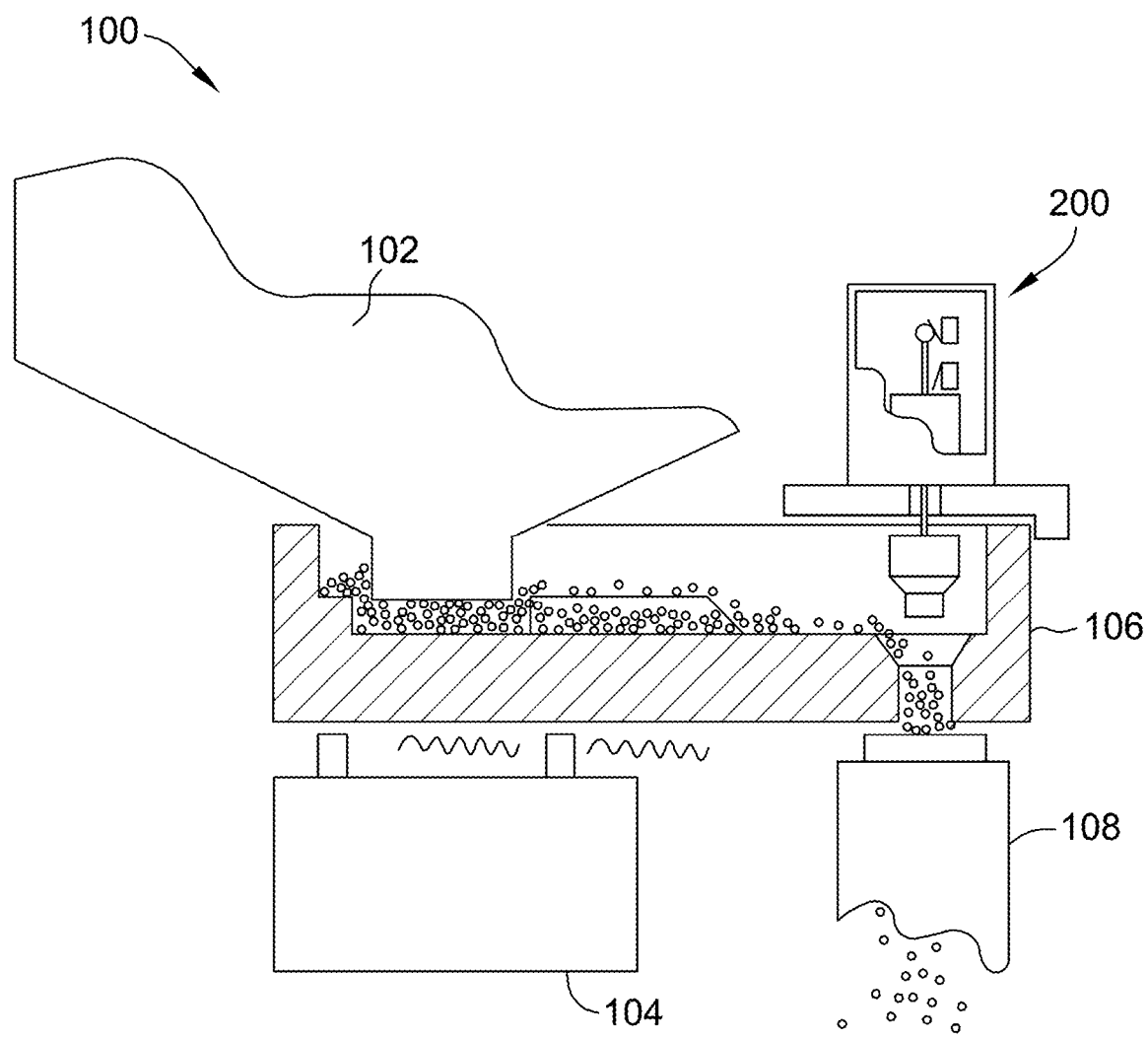
FIG. 2 is a portion of the polysilicon feeder shown in FIG. 1 with some details omitted for clarity.

Referring now to FIG. 2, the polysilicon feeder 100 shown in FIG. 1 is depicted in greater detail. Polysilicon feeder 100 includes valve mechanism 200 in some embodiments. Valve mechanism 200 is configured to engage and disengage with interchangeable tray 106 to stop the flow of polysilicon into guide tube 108. For example, vibrator 104 may be turned off or otherwise not vibrating interchangeable tray 104, but movement of polysilicon feeder 100 may none the less cause polysilicon to exit interchangeable tray 106 and enter guide tube 108. Valve mechanism 200 may be engaged (e.g., as controlled by a control system such as a programmable logic controller) and cause a seal to engage (e.g., seat with) an exit portion of interchangeable tray 106. The seal of valve mechanism 200 prevents polysilicon from exiting interchangeable tray 106 and entering guide tube 108.

As shown in FIG. 2, hopper 102 supplies polysilicon (e.g., granular or chunk polysilicon) to interchangeable tray 106. In this embodiment, hopper 102 includes an outlet that is positioned above interchangeable tray 106 opposite an exit of interchangeable tray 106. The outlet supplies guide tube 108 with polysilicon when vibrator 104 vibrates interchangeable tray 106. The vibration of interchangeable tray 106 by vibrator 104 causes polysilicon to exit interchangeable tray 106 from the exit and enter guide tube 108. Guide tube 108 includes an exit into the crucible used for crystal generation such that polysilicon entering guide tube 108 exits into the crucible.

In this embodiment, vibrator 104 includes a magnetic pulse vibrator. The magnetic pulse vibrator controls the flow of polysilicon from interchangeable tray 106 (e.g., one of either a granular tray 300 or a chunk tray 400) to the crucible. The magnetic pulse vibrator includes an electromagnetic energy source that vibrates one of either the granular tray 300 or the chunk tray 400 through the emission of electromagnetic energy. The magnetic pulse vibrator also includes a controller that controls a feed rate of one of either the granular tray 300 or the chunk tray 400 through control of the voltage supplied to the electromagnetic energy source.

In one embodiment, the magnetic pulse vibrator uses magnetic pulses to drive a spring-biased table. The magnetic pulse may be generated, for example, by selectively applying a voltage having a variable amplitude and/or variable frequency of application to a coil. This results in a magnetic pulse that interacts with a core to drive (e.g., move or displace) the core. The core is connected to the table such that when the core is displaced by a magnetic pulse from the coil, the core displaces the table. A spring or other suitable mechanism biases the table and connected core to a rest position from which the core is displaced by the magnetic pulse. The movement of the core generates vibrations that in turn drive interchangeable tray 106. For example, interchangeable tray 106 may be connected to the table which is driven by the connected core and the coil.

The magnetic pulse vibrator may be controlled by both voltage and frequency. The voltage and frequency are linked control parameters which interact to control the magnetic pulse vibrator and feed rate of polysilicon feeder 100. By varying the amplitude of the voltage applied, the strength of the magnetic pulse and the amount of displacement of the core and table is varied. This control determines the strength of the vibration applied to interchangeable tray 106. By varying the frequency with which the voltage is applied, the frequency of the vibration applied to interchangeable tray 106 is controlled. One or more of voltage frequency and voltage amplitude may be used to vibrate interchangeable tray 106 to meet a set point for a polysilicon feed rate (e.g., in kg of polysilicon per hour).

In an alternative embodiment, the magnetic pulse vibrator drives interchangeable tray 106 directly with magnetic pulses. For example, interchangeable tray 106 may include one or more portions that are magnetic and that are displaced by the magnetic pulses generated by the magnetic pulse vibrator.

Figure 3A:
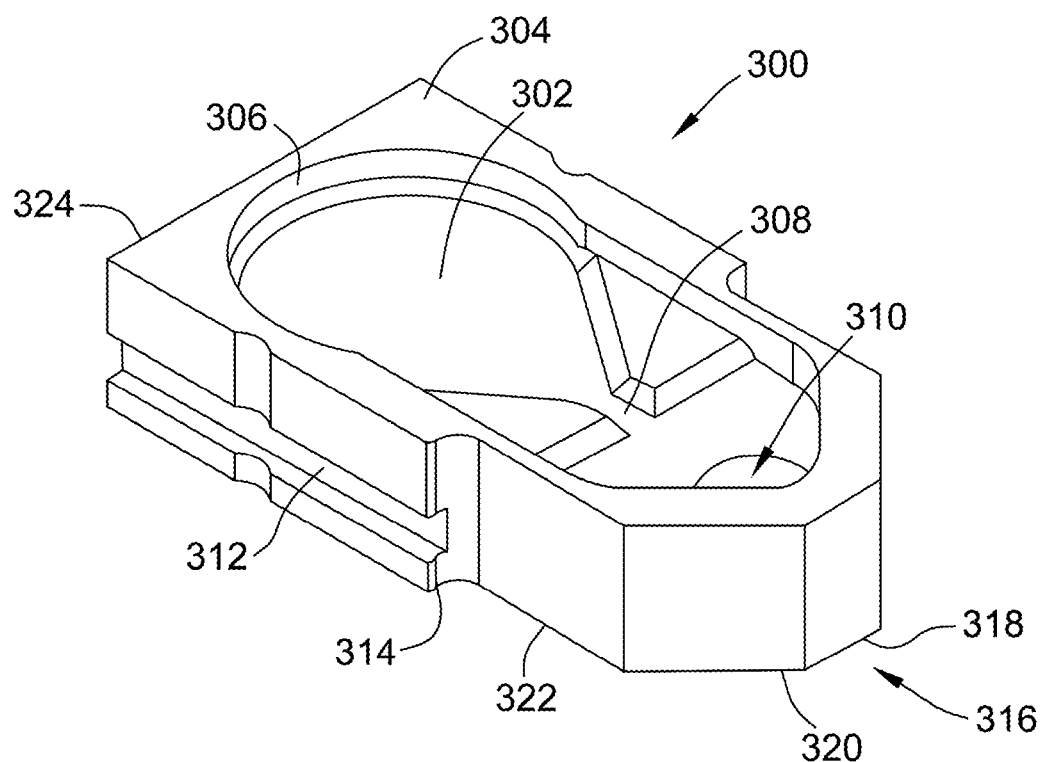
FIG. 3A is a perspective view of a granular tray for use with granular polysilicon and the polysilicon feeder shown in FIG. 1.
Figure 3B:
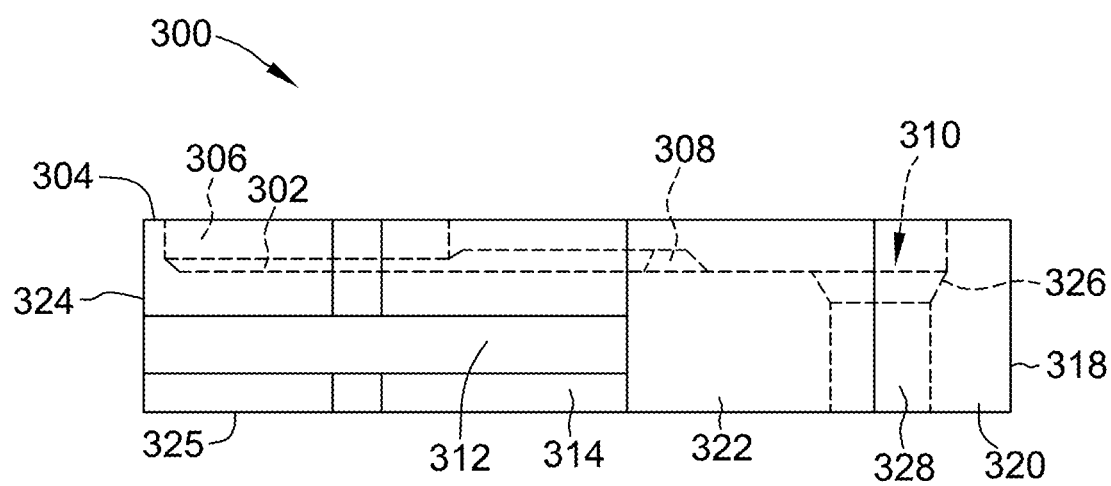
FIG. 3B is a side view of the granular tray shown in FIG. 3A.

Referring now to FIGS. 3A and 3B, a granular tray 300 is shown according to one embodiment. Granular tray 300 is one type of interchangeable tray 106 for use with granular polysilicon and polysilicon feeder 100 shown in FIGS. 1 and 2. Granular tray 300 includes an exterior portion that removably receives a support rail of the feed assembly, and granular tray 300 includes an interior profile that receives granular polysilicon from a feed material reservoir (e.g., hopper 102) of polysilicon feeder 100. The interior profile of granular tray 300 has a depth less than a second interior profile of a chunk tray 400 (shown in FIG. 4A).

In operation, granular tray 300 may be removed from the feed system of polysilicon feeder 100. This allows granular tray 300 to be replaced by chunk tray 400 when polysilicon feeder 100 is to be used with chunk polysilicon rather than granular polysilicon. Granular tray 300 is interchangeable with chunk tray 400 as polysilicon feeder 100 includes support rails and a cavity sized to receive either granular tray 300 or chunk tray 400. The exterior portion of granular tray 300 includes two exterior channels 312 on opposing sides that removably receive the support rails of the feed assembly included in polysilicon feeder 100. This allows granular tray 300 to be removed and replaced with chunk tray 400. As explained in greater detail with reference to FIGS. 4A-4C, chunk tray 400 includes an exterior channel having the same dimensions as exterior channel 312 of granular tray 300. In some embodiments, granular tray 300 and chunk tray 400 have the same outer dimensions to facilitate interoperability with polysilicon feeder 100. Chunk tray 400 can similarly be removed and replaced with granular tray 300.

Referring now to FIG. 3A, granular tray 300 includes an inner profile defined by at least a bottom 302, a wall 306, a funnel 308, and an exit 310. The interior profile of granular tray 300 receives granular polysilicon from hopper 102. The granular polysilicon is received by the portion of the inner profile opposite exit 310 and prior to funnel 308. For example, the portion of the interior profile that receives granular polysilicon may be substantially circular tapering to funnel 308, as shown. Bottom 302 is recessed from a top surface 304 of granular tray 300 by a depth defined by wall 306. Wall 306 may be tapered, radiused, or the like to reduce the likelihood of granular polysilicon becoming trapped at the corner of or right angle formed between wall 306 and bottom 302. Granular tray 300 has a constant depth with bottom 302 at the same depth relative to top surface 304 for the entirety of bottom 302.

In alternative embodiments, bottom 302 includes a first portion at a first depth prior to funnel 308 and a second portion at a greater depth past funnel 308, the second portion including exit 310. This stepped bottom 302 may facilitate feeding of granular polysilicon by granular tray 300. In alternative embodiments, bottom 302 has other configurations. For example, bottom 302 may include a sloped portion that slopes towards exit 310.

Funnel 308 is defined by raised sections that extend above bottom 302. The raised sections have a height less than that of top surface 304. In alternative embodiments, the raised sections forming funnel 308 extend to the same height as that of top portion 304. Funnel 308 facilitates feeding of granular polysilicon when granular tray 300 is vibrated by vibrator 104. For example, funnel 308 may prevent granular polysilicon exiting hopper 102 from exiting granular tray 300 through exit 310 when vibrator 104 is not driving granular tray 300. Funnel 308 may impede the travel of granular polysilicon from hopper 102 when granular tray 300 is not vibrating.

Granular tray 300 includes outer dimensions defined by exterior surfaces 316 including at least the top surface 304, the exterior channels 312 formed in side portions 314, a side 322, an angled side 320, a front 318, a back 324, and a bottom 325. The dimensions and exterior surfaces of granular tray 300 are sized and shaped such that granular tray 300 can be inserted into polysilicon feeder 100. For example, the height of granular tray 300, defined by top surface 304 and bottom 325; the width of granular tray 300, defined by side portions 314; and the length of granular tray 300, define by front 318 and back 324, are sized to fit within an opening in polysilicon feeder 100. When inserted into the opening in polysilicon feeder 100, granular tray 300 is positioned below hopper 102 and above vibrator 104. Exterior channels 312 receive guide rails of polysilicon feeder 100 that position granular tray 300 vertically. Bottom 325 may be in contact with vibrator 104 or a vibration table driven by vibrator 104. Alternatively, granular tray 300 is supported above vibrator 104 by the guide rails and exterior channel 312. Top surface 304 may be in contact with hopper 102 or other portions of portions of polysilicon feeder 100.

Exterior channels 312 are included within side portions 314 that extend from side 322. Side portions 314, exterior channel 312, and side 322 extend from back 324. Sides 322 taper to front 318 creating angled sides 320. In some embodiments, the opening in polysilicon feeder 100 is dimensioned such that granular tray 300 may not be fully inserted if inserted back 324 first rather than front 318 first.

Referring now to FIG. 3B, exterior channels 312 included in side portion 314 extend forward from back 324. Exterior channels 312 are disposed above bottom 325. Alternatively, exterior channels 312 may be level with bottom 325. In other embodiments, exterior channels 312 include a single flange that extends from side 322, side portion 314, or another suitable surface. The single flange is positioned above the guide rails when granular tray 300 is inserted into polysilicon feeder 100. Sides 322 taper to front 318 and include angled portions 326. In still other embodiments, exterior channels 312 or other support mechanisms (e.g., flanges) may be positioned in other locations (e.g., extending backward from a front end of side 322).

Bottom 302 is recessed from top surface 304. Wall 306 extends downward from top surface 304 to bottom 302 and is chamfered at the junction between bottom 302 and wall 306. Funnel 308 is located between back 324 and exit 310 such that a flow of polysilicon entering granular tray 300 from hopper 102 must pass through a narrower section defined by funnel 308 before exiting granular tray 300. Exit 310 is circular with a chamfered opening portion 326 that has a decreasing radius to a second portion 328 of exit 310. Second portion 328 has a fixed radius. As described with reference to FIGS. 7A and 7B, these features in combination with valve mechanism 200 prevent polysilicon from inadvertently exiting granular tray 300 into guide tube 108 for supplying polysilicon to a crucible used in generating a semiconductor crystal.

Figure 4A:
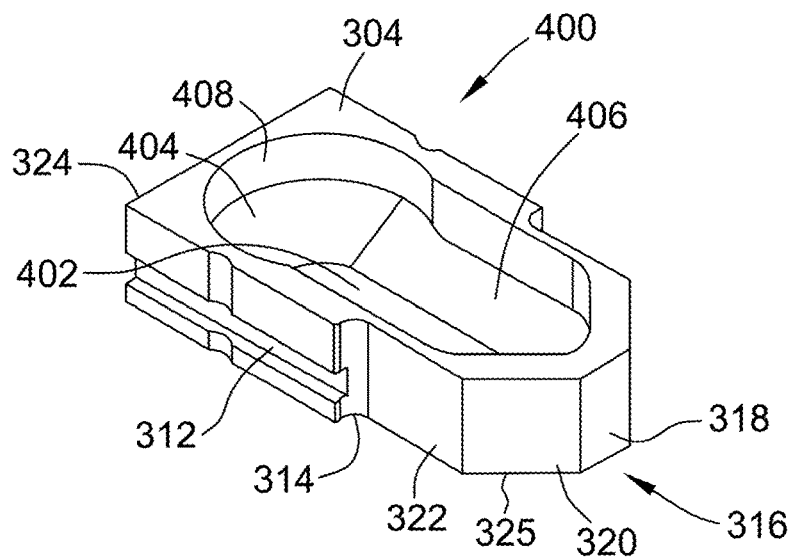
FIG. 4A is a perspective view of a chunk tray for use with chunk polysilicon and the polysilicon feeder shown in FIG. 1.
Figure 4B:
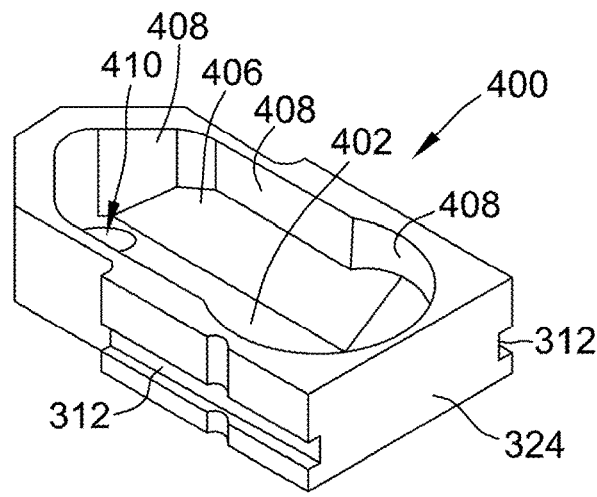
FIG. 4B is a reverse perspective view of the chunk tray shown in FIG. 4A.
Figure 4C:
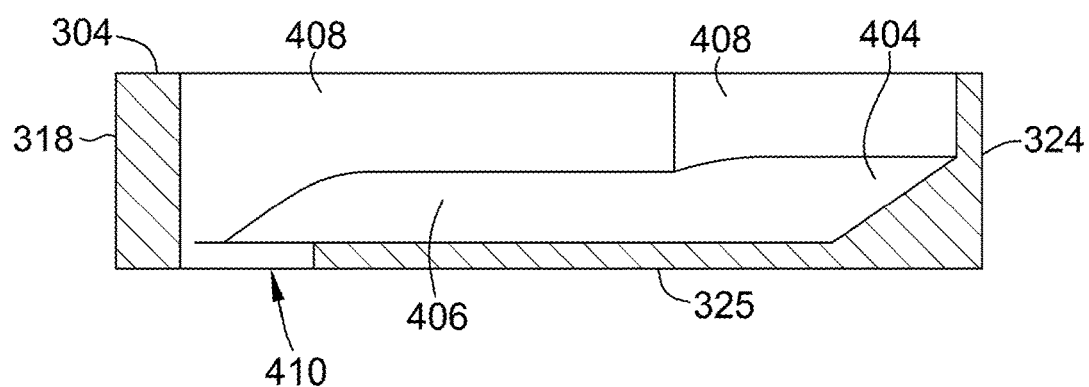
FIG. 4C is a sectional view of the chunk tray shown in FIG. 4A.

Referring now to FIGS. 4A-4C, a chunk tray 400 of one embodiment is another type of interchangeable tray 106 for use with chunk polysilicon and polysilicon feeder 100 shown in FIGS. 1 and 2. Chunk tray 400 has the same outer dimensions as granular tray 300. This allows chunk tray 400 and granular tray 300 to be used interchangeably with polysilicon feeder 100.

Referring specifically to FIG. 4A, chunk tray 400 includes exterior surfaces 316 defined by at least the top surface 304, the exterior channel 312 formed in the side portion 314, the side 322, the angled side 320, the front 318, the back 324, and the bottom 325. Exterior surfaces 316 of chunk tray 400 have the same dimensions and configuration as exterior surfaces 316 of granular tray 300. Chunk tray 400 includes two exterior channels 312 that removably receive the support rails of the feed assembly of polysilicon feeder 100. The exterior channels 312 are located on opposing sides of chunk tray 400. The exterior surfaces 316 of chunk tray 400 perform the same functions as the exterior surfaces of granular tray 300 previously described herein in reference to FIGS. 3A-3B.

In operation, chunk tray 400 is inserted into polysilicon feeder 100 such that the support rails of polysilicon feeder 100 are inserted within channels 312. The support rails support chunk tray 400. The support rails and channels 312 allow chunk tray 400 to be removed and replaced with a granular tray 300.

Referring now to FIGS. 4A and 4B, chunk tray 400 includes an interior profile that receives chunk polysilicon from a feed material reservoir (e.g., hopper 102) of polysilicon feeder 100. The interior profile of chunk tray 400 is defined by a bottom 402, a bowl 404, sides 406, and a wall 408. Wall 408 is perpendicular to top surface 304 and extends downward from top surface 304. Bowl 404 extends from wall 408 to bottom 402 and is located opposite an exit 410. When inserted into polysilicon feeder 100, bowl 404 is positioned beneath an outlet of hopper 102 such that polysilicon exiting hopper 102 enters chunk tray 400 over bowl 404. Bowl 404 is generally circular or semicircular and has a profile, viewed from above, of a fraction of a circle (e.g., ⅔ of a circle, ½ of a circle, or the like). Bowl 404 has a first radius at the junction between the top of bowl 404 and wall 408. Bowl 404 has a second radius, less than the first radius, at the junction between bowl 404 and bottom 402. The radius of bowl 404 decreases linearly from the first radius to the second radius. In alternative embodiments, bowl 404 may have other shapes.

Sides 406 extend downward from wall 408 and meet bottom 402. Sides 406 also extend horizontally between bowl 404 and wall 408 opposite bowl 404. Sides 406 are angled to extend inwards toward exit 410 as sides 406 approach bottom 402. Exit 410 has a circular opening through bottom 402. Bottom 402 is flat. In alternative embodiments, bottom 402 is slopped towards exit 410.

Referring now to FIG. 4C, a section of chunk tray 400 is shown. Wall 408 extends downward from top surface 304 and meets bowl 404 and sides 406. Wall 408, bowl 404, and sides 406 funnel toward the centerline of chunk tray 400 running from back 324 to front 318. Bowl 404 extends approximately one third of the length of chunk tray 400 with sides 406 approximately two thirds the length of chunk tray 400. Sides 406 have a first portion of constant height followed by a second portion in which the height decreases as the sides 406 near exit 410. In this embodiment, the height decreases first non-linearly and then linearly. In alternative embodiments, sides 406, bowl 404, wall 408, or the like may have different shapes or configurations.

Referring to FIGS. 3A-4C, chunk tray 400 has an interior profile (e.g., defined by wall 408, bowl 404, sides 406, and bottom 402) that differs from the interior profile of granular tray 300. The interior profile of chunk tray 400 has a greater depth than the interior profile of granular tray 300. The opening of exit 410 of the chunk tray is disposed lower above bottom 325 than the opening of exit 310 of granular tray 300. Additionally, wall 408 of chunk tray 400 has a greater height than wall 306 of granular tray 300. The deeper profile of chunk tray 400 facilitates feeding of chunk polysilicon.

Referring again to FIGS. 4A-4C, in operation, angled sides 406 and bowl 404 of chunk tray 400 facilitate feeding of polysilicon to exit 410. The polysilicon enters bowl 404 from hopper 102 and is funneled toward exit 410 by bowl 404, sides 406, and bottom 402. Chunk tray 400 is driven by vibrator 104 that causes the polysilicon to exit chunk tray 400 through exit 410.

Granular tray 300 and chunk tray 400 are suitably made of, or include a substantial portion of, silicon. Use of silicon inhibits contamination of the crucible melt, for example, in the event that the tray is chipped. If the chip enters the melt and the tray is made of silicon, minimal contamination will result. In alternative embodiments, granular tray 300 and chunk tray 400 may be constructed of different material(s) such as polytetrafluoroethylene, quartz, or other suitable materials. For example, the interchangeable trays 106 may be constructed of one or more materials with a relatively high hardness, such as quartz, to resist chipping.

Figure 5A:
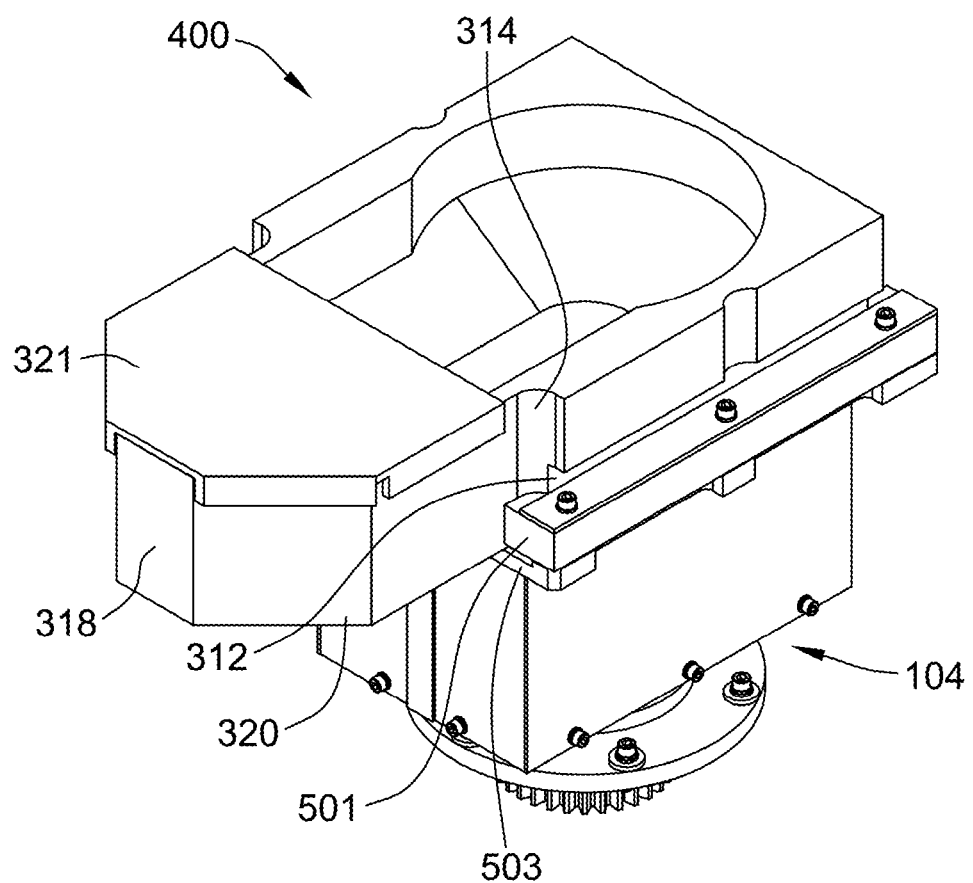
FIG. 5A is a perspective view of the chunk tray shown in FIG. 4A connected to the vibrator shown in FIG. 1.
Figure 5B:
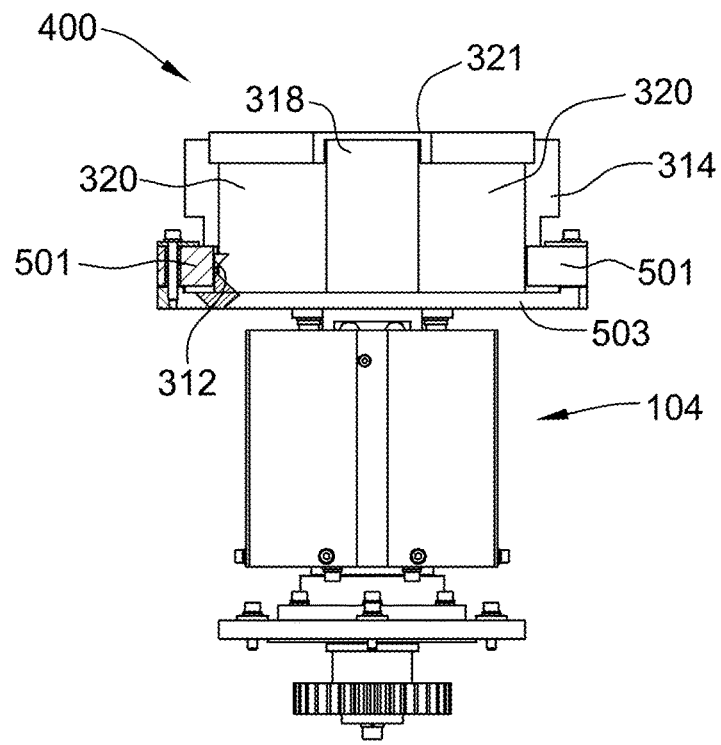
FIG. 5B is a front, partial section view of the chunk tray and vibrator shown in FIG. 5A.
Figure 5C:
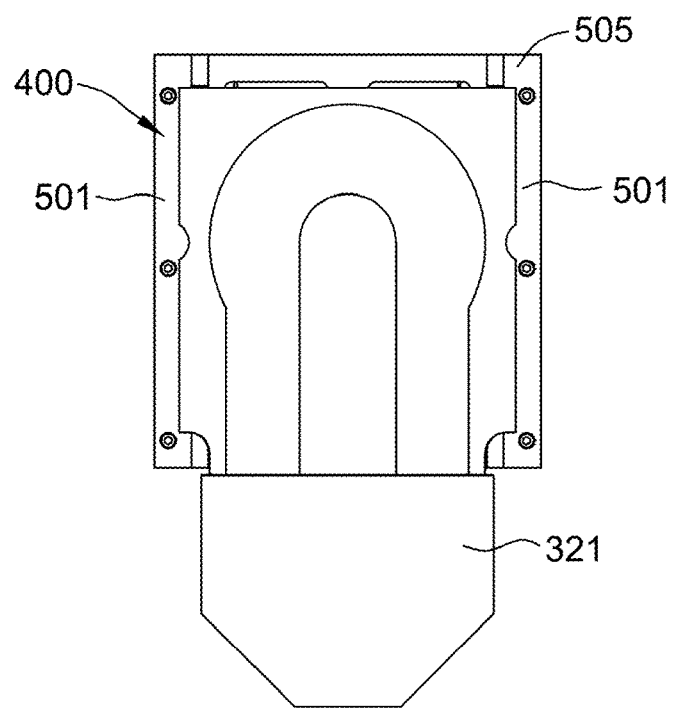
FIG. 5C is a top view of the chunk tray and vibrator shown in FIG. 5A.

Referring now to FIGS. 5A-5C, chunk tray 400 is removably connected to vibrator 104 by receiving a pair of rails 501 in exterior channels 312. Although depicted with chunk tray 400, vibrator 104 may be similarly connected to granular tray 300.

Each rail 501 is connected to a table 503 of vibrator 104. For example, each rail 501 is connected to table 503 by brackets, fasteners, or other suitable components. Each rail 501 extends above table 503 and extends inward towards the center of table 503. Each rail 501 extends for at least a portion of the length of table 503. Each rail 501 further includes a rear stop 505 which prevents over insertion of chunk tray 400. Each rear stop 505 extends inward towards the center of table 503 from each rail 501.

When chunk tray 400 is attached to vibrator 104, each rail 501 extends within a corresponding exterior channel 312. Each rail 501 extends within side portion 314 in the space defined by exterior channel 312. Interference between exterior channel 312 in side 314 and rail 501 prevents lateral movement and vertical movement of chunk tray 400. The bottom 325 of chunk tray 400 rests on table 503. The back 324 of chunk tray 400 is in contact with each rear stop 505. Interference between back 324 and each rear stop 505 prevents rearward movement of chunk tray 400. Granular tray 300 is connected to vibrator 104 by the pair of rails 501, table 503, and rear stops 505 in the same manner.

In some embodiments, chunk tray 400, or granular tray 300, is partially covered with cover 321. Cover 321 includes lips which extend over top surface 304 and partially over side 322, and angled side 320 to secure cover 321.

Figure 6A:
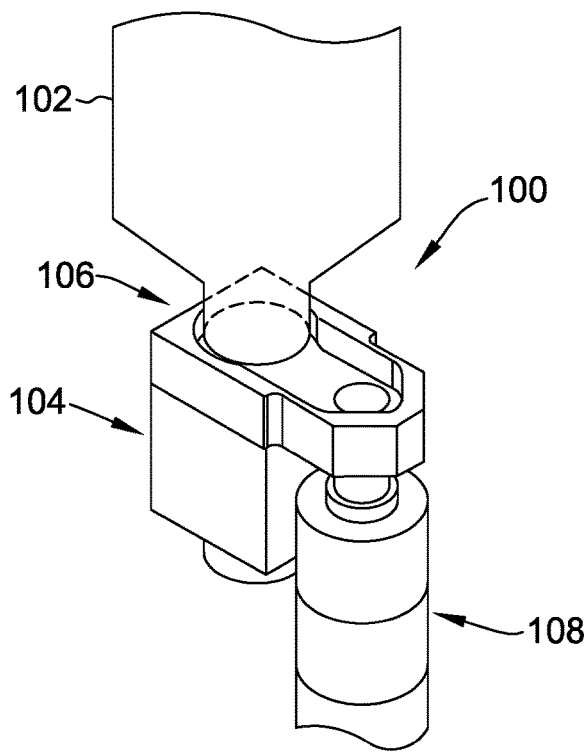
FIG. 6A is a perspective view of the polysilicon feeder shown in FIG. 1 in a feeding position.
Figure 6B:
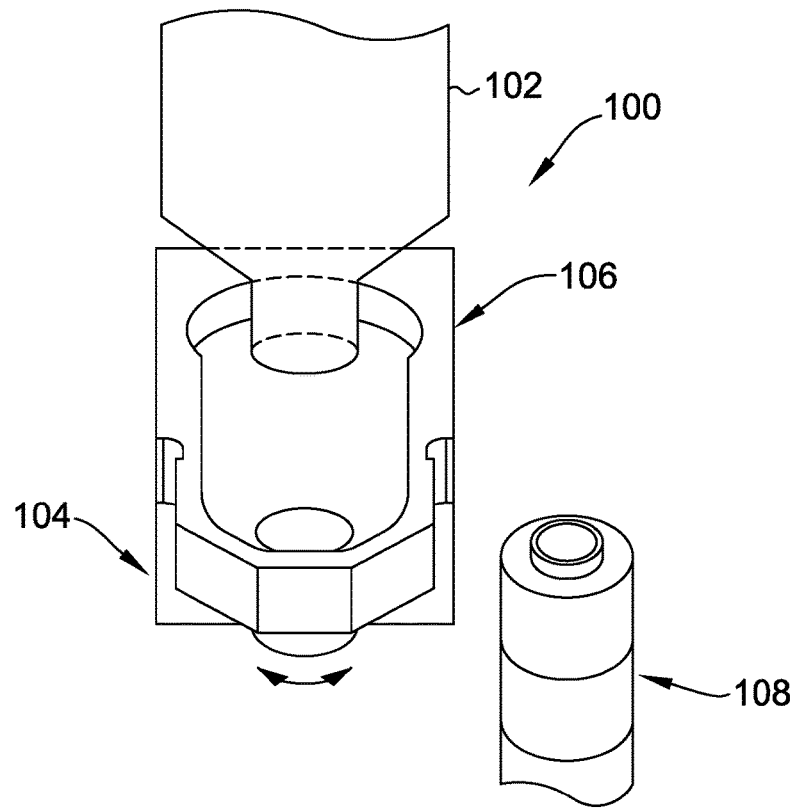
FIG. 6B is perspective view of the polysilicon feeder shown in FIG. 1 in a parked position.

Referring now to FIGS. 6A and 6B, vibrator 104 and interchangeable tray 106 are movable between a feeding position (shown in FIG. 6A) and a parked position (shown in FIG. 6B). In the feeding position, vibrator 104 and interchangeable tray 106 are positioned such that an exit of interchangeable tray 106 is positioned above guide tube 108. In some embodiments, guide tube 108 is in contact with interchangeable tray 106.

In the parked position, vibrator 104 and interchangeable tray 106 are rotated away from guide tube 108. For example, the parked position may be seventy degrees from the feeding position. The parked position provides access to interchangeable tray 106 such that interchangeable tray 106 may be replaced with a different interchangeable tray 106. For example, in the parked position, a granular tray 300 may be replaced with a chunk tray 400.

In operation, guide tube 108 is lowered. Vibrator 104 and interchangeable tray 106 are moved into the feeding position from the parked position prior to feeding polysilicon to a crucible. Vibrator 104 is rotated from the parked position to the feeding position. In one embodiment, vibrator 104 is rotated using a motor. In an alternative embodiment, vibrator 104 is rotated by hand. Interchangeable tray 106 rotates with vibrator 104 due to the connection described above. In some embodiments, guide tube 108 is contact with interchangeable tray 106.

Once vibrator 104 and interchangeable tray 106 are in the feeding position, vibrator 104 is turned on. Vibrations from vibrator 104 cause polysilicon from interchangeable tray 106 to exit into guide tube 108. Guide tube 108 guides the polysilicon exiting interchangeable tray 106 into a crucible. Hopper 102 feeds polysilicon into interchangeable tray 106 to replace polysilicon exiting interchangeable tray 106. Vibrator 104 is turned off.

Vibrator 104 and interchangeable tray 106 are moved into the parked position from the feeding position. Vibrator 104 is rotated from the feeding position to the parked position. Interchangeable tray 106 rotates with vibrator 104. In some embodiments, guide tube 108 is raised after vibrator 104 is rotated to the parked position.

While in the parked position, interchangeable tray 106 may be removed from vibrator 104. For example, granular tray 300 may be removed from vibrator 104. A replacement interchangeable tray 106, for example a chunk tray 400, may be connected to vibrator 104. The parked position allows for the swapping of interchangeable trays 106.

In some embodiments, a valve mechanism (shown in FIGS. 7A and 7B) is used to seal exit 310 of granular tray 300 before granular tray 300 is moved from the feeding position to the parked position. The valve mechanism prevents polysilicon from exiting granular tray 300 due to the movement of granular tray 300 from the feeding position to the parked position. The valve mechanism rotates with vibrator 104 and interchangeable tray 106. The valve mechanism is removably connected to granular tray 300. For example, the valve mechanism may be connected to cover 321. In alternative embodiments, the valve mechanism is connected to vibrator 104.

Figure 7A:
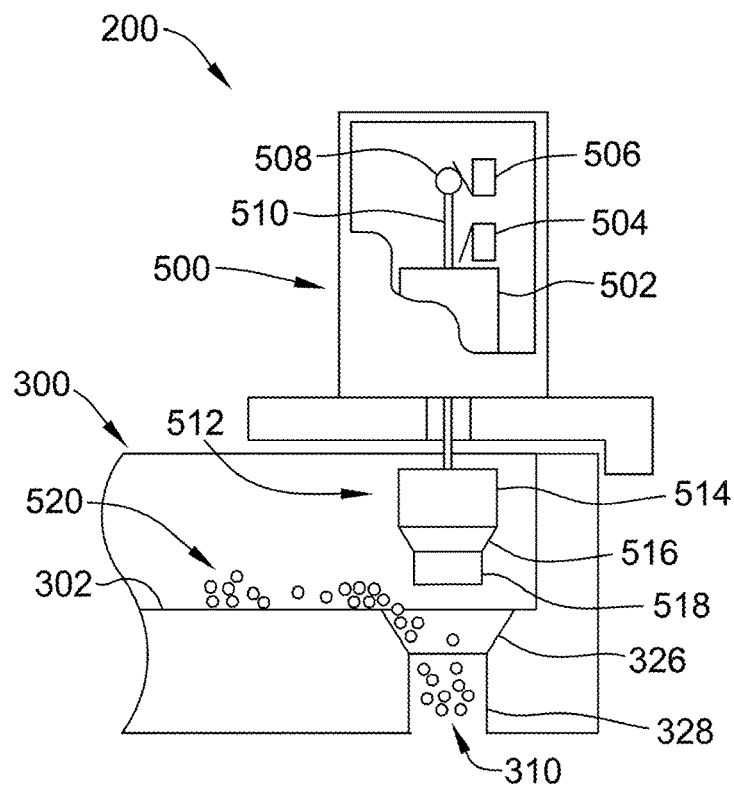
FIG. 7A is a partially schematic side view of a valve mechanism of the polysilicon feeder shown in FIG. 1 in an open position.

Valve mechanism 200 controls the flow of polysilicon through exit 310 of granular tray 300. As shown in FIG. 7A, valve mechanism 200 is in an open state. Valve mechanism 200 of this embodiment is not used with chunk tray 400 because the relatively larger size of chunk polysilicon prevents chunk polysilicon from inadvertently exiting chunk tray 300 (e.g., due to movement of polysilicon feeder 100). The smaller size of granular polysilicon allows granular polysilicon to be forced or moved through exit 310 by movement of polysilicon feeder 100, for example. Valve mechanism 200 seals exit 310 of granular tray 300. In alternative embodiments, valve mechanism 200 is used in conjunction with both granular tray 300 and chunk tray 400. Valve mechanism 200 includes a seal 512 and a driving system 500.

Figure 7B:
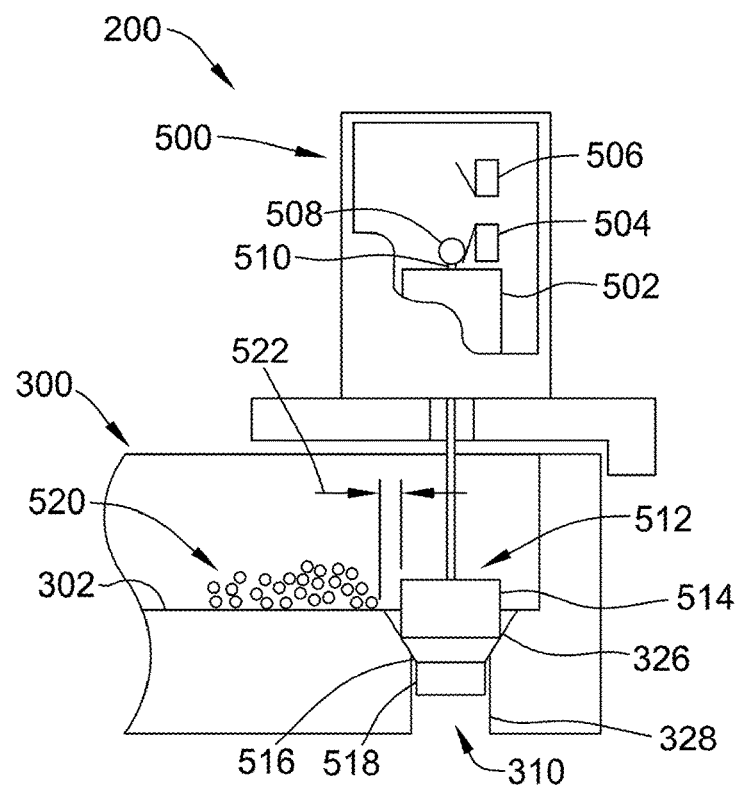
FIG. 7B is a partially schematic side view of the valve mechanism shown in FIG. 7A in a closed position.

Driving system 500 of this embodiment is a solenoid for moving seal 512 between a sealed position and an open position. In the sealed position (as shown in FIG. 7B), seal 512 obstructs or closes exit 310. In the open position (as shown in FIG. 7A), seal 512 does not obstruct exit 310 for relatively free flow of material. Driving system 500 includes driver 502 that raises seal 512 when active, for example, by applying a magnetic field to linkage 510 extending through driver 502 and connected to seal 512. Driver 502 may be a series of windings that are energized by a control circuit to apply a magnetic field to linkage 510. The magnetic field causes linkage 510 to be driven upward. In alternative embodiments, driver 502 is a different mechanical or electromechanical system from providing linear motion such as a cam and camshaft, hydraulic actuator, rack and pinion, or the like. Linkage 510 connects seal 512 to driving system 500 and when driven upward raises seal 512 to the open position.

Valve mechanism 200 is normally closed. When driver 502 is not active, the force of gravity causes seal 512 to lower into the sealed position. In some further embodiments, driving system 500 includes a spring to return seal 512 to the normally closed position. In alternative embodiments, valve mechanism 200 is normally open. A spring maintains linkage 510 and seal 512 in the open position. When activated, driver 502 applies a magnetic field to linkage 510 that drives linkage 510 downward causing sealing portion 512 to move to the sealed position.

Driving system 500 also includes an upper position switch 506 and a lower position switch 504. Position switches 504, 506 each include a lever positioned to interfere with a top portion 508 of linkage 510. Interference between top portion 508 of linkage 510 and one of upper position switch 506 or lower position switch 504 causes the respective switch to provide an indication of the position of seal 512, open and sealed, respectively.

Seal 512 is shaped to interface with exit 310 and bottom 302 of granular tray 300. The shape of seal 512 obstructs exit 310 when in the sealed position and prevents polysilicon from exiting granular tray 300 through exit 310. In the open position, seal 512 does not contact granular tray 300. Seal 512 includes a first section 514, a second section 516, and a third section 518. Each section corresponds to a different portion of granular tray 300 (e.g., angled portion 326 and second portion 328) to facilitate obstruction of exit 310. For example, exit 310 is circular when viewed from above and each section of seal 512 is circular when viewed from above.

Referring now to FIG. 7B, when in the sealed position, seal 512 obstructs exit 310 of granular tray 300. Third section 518 of seal 512 has a radius less than the radius of second portion 328 of exit 310. This allows third section 518 of seal 512 to enter second portion 328 of exit 310 when sealing exit 310. Third section 518 of seal 512 may have a radius sufficiently large to create a running fit, interference fit, or the like with second portion 328 of exit 310.

Second section 516 of seal 512 extends from third section 518 to first section 514. Second section 516 has a decreasing radius from the larger radius of first section 514 to the smaller radius of third section 518. The radius of second section 516 decreases linearly. The decreasing radius of second section 516 matches the decreasing radius of angled portion 326 of exit 310. The radius of second section 516 decreases at the same rate as the radius of angled portion 326. The slope of second section 516 is equal to that of angled portion 326. When in the sealed position, second section 516 is in contact with angled portion 326 of exit 310. This seals exit 310 and prevents polysilicon from exiting granular tray 300. The height of second section 516 is less than the height of angled portion 326. Second section 516 terminates at first section 514.

First section 514 has a fixed radius equal to the largest radius of second section 516. First section 514 extends upward from section 516 and is coupled to linkage 510. First section 514 has a radius less than the largest radius of angled portion 326 of exit 310. This creates a gap 522 between first section 514 and the opening of exit 310 when seal 512 is in the sealed position. First section 514 extends at least partially into angled portion 326 of exit 310. First section 514 may also extend above exit 310.

Gap 522 between seal 512 and exit 310 ensures that no granular polysilicon within exit 310 blocks seal 512 from contacting exit 310 which would prevent a seal from forming. Angled portion 326 of exit 310 causes any polysilicon within angled portion 326 to pass through exit 310 prior to seal 512 being moved to the sealed position. Angled portion 326 is free of polysilicon due to the angle. Therefore, no polysilicon can prevent a seal between seal 512 and exit 310 as second section 516 only contacts angled portion 326 where no polysilicon is present. First section 514 does not contact bottom 302 and is separated from bottom 302 by gap 522 such that polysilicon on bottom 302 does not impede seal 512 from sealing within exit 310.

Referring now to FIGS. 7A and 7B, in operation, driving system 500 raises and lowers seal 512 to seat and unseat with exit 310. Seal 512 is normally closed to prevent polysilicon from inadvertently exiting through exit 310. Driving system 500 lifts seal 512 into the open position by activating driver 502. This allows polysilicon to exit granular tray 300 through exit 310. Driving system 500 allows sealing mechanism 512 to return to the sealed position. Seal 512 contacts angled portion 326 of exit 310 to form a seal that prevents polysilicon from exiting granular tray 300 through exit 310.

Position switches 504, 506 are triggered when a top portion 508 of linkage 510 contacts a lever portion of limit switches 504, 506. When top portion 508 of linkage 510 contacts and moves the lever portion of upper position switch 506, upper position switch 506 is triggered and indicates that seal 512 is in the open position. When top portion 508 of linkage 510 contacts and moves the lever portion of lower position switch 504, lower position switch 504 is triggered and indicates that seal 512 is in the sealed position.

Figure 8:
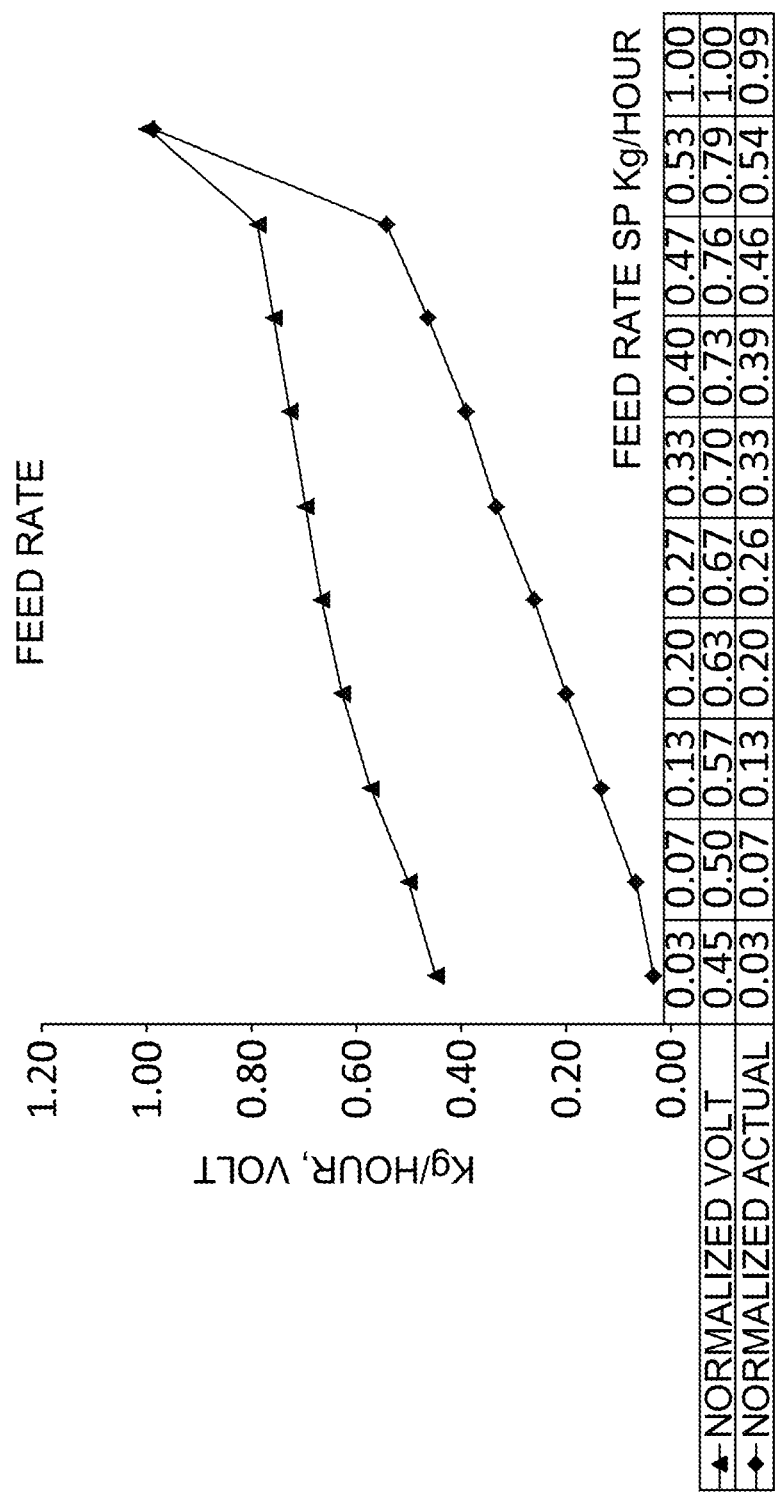
FIG. 8 is a graph of the relationship between voltage supplied to the magnetic pulse vibrator shown in FIG. 2 and the feed rate of polysilicon provided by the polysilicon feeder.

Referring now to FIG. 8, the feed rate of polysilicon feeder 100 is controlled by varying the amount of voltage supplied to a magnetic pulse vibrator in some embodiments. The normalized voltage supplied to the magnetic pulse vibrator has a relationship with the normalized feed rate that corresponds to the voltage supplied to the magnetic pulse vibrator. By varying the voltage applied to the magnetic pulse vibrator, the feed rate of polysilicon feeder 100 is controllable. Based on the relationship between voltage and feed rate, a desired feed rate can be achieved by supplying a predetermined amount of voltage to the magnetic pulse vibrator. In some further embodiments, the magnetic pulse vibrator is also controlled by varying the frequency with which the voltage is supplied to the magnetic pulse vibrator.

The interchangeable trays described herein allow the polysilicon feeder to supply either granular or chunk polysilicon to a crucible for silicon crystal generation using the Czochralski method. By inserting the corresponding tray, the polysilicon feeder is capable of supplying a controlled rate of granular or chunk polysilicon to the crucible used in generating the silicon crystal. Advantageously, this allows the polysilicon feeder to use either source of polysilicon. For example, where only one source is available (e.g., chunk polysilicon), the corresponding tray is inserted into the polysilicon feeder and the crucible is supplied with polysilicon according to the parameters for crystal generation (e.g., a rate of polysilicon supply). Only a single source may be available due to supply issues or supply chain issues. The ability to easily switch from one polysilicon source to another provides greater supply security as different types of polysilicon may be used and therefore a greater number of supply sources are available. In some cases, it may be more economical to use a particular source of polysilicon (granular or chunk) depending on fluctuations in price. The polysilicon feeder is capable of operating more economically than a fixed source polysilicon feeder as the polysilicon feeder can adapt to either source using the interchangeable trays.

Granular polysilicon has several advantages including providing for easy and precise control of the feed rate due to the smaller size. However, the cost of granular polysilicon is typically higher than that of chunk polysilicon due to the chemical vapor deposition process or other manufacturing methods used in its production. Chunk polysilicon has the advantage of being cheaper and being capable of a higher feed rate given its larger size. By being capable of supplying either granular polysilicon or chunk polysilicon to a melt for crystal growth, the polysilicon feeder can selectively make use of the advantages of either polysilicon type and provides increased supply security by being compatible with either polysilicon type.

In some embodiments, the polysilicon feeder includes a magnetic pulse vibrator that supports the use of interchangeable polysilicon trays. The magnetic pulse vibrator vibrates either interchangeable polysilicon tray (e.g., the granular tray or the chunk tray) at variable rates using magnetic pulses. The rate may be controlled based on the frequency and/or magnitude of voltage supplied to the magnetic pulse vibrator. The magnetic pulse vibrator is capable of providing a wide range of vibration rates, magnitudes, or both which allows the polysilicon feeder to provide a specific feed rate when using either granular polysilicon, with the granular tray, or chunk polysilicon, with the chunk tray.

In further embodiments, the polysilicon feeder includes a valve mechanism. The valve mechanism engages and disengages with one of the two interchangeable trays (e.g., the granular tray) to selectively prevent polysilicon from feeding into the crucible regardless of the state of the vibrator driving the tray. For example, the polysilicon feeder may be moved or shifted (e.g., when the vibrator is not active). This movement may cause polysilicon to fall from the tray and enter the crucible at an unintended time. This polysilicon inadvertently added to the melt in the crucible functions as an impurity and degrades crystal quality. The valve mechanism engages with the interchangeable tray to seal an exit preventing polysilicon from exiting the interchangeable tray into the melt.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements. The use of terms indicating a particular orientation (e.g., "top", "bottom", "side", "down", "up", etc.) is for convenience of description and does not require any particular orientation of the item described.

As various changes could be made in the above constructions and methods without departing from the scope of the invention, it is intended that all matter contained in the above description and shown in the accompanying drawing[s] shall be interpreted as illustrative and not in a limiting sense.

What is claimed is:

1. A valve mechanism for controlling the flow of polysilicon from a granular tray of a polysilicon feed assembly to a growth chamber for growing a crystal ingot from a melt, the valve mechanism comprising:
    a seal that selectively obstructs an exit of the granular tray;
    a driver configured to raise and lower the seal between a sealed position obstructing the exit and an open position in which the seal does not obstruct the exit; and
    a linkage connecting the seal to the driver,
    wherein the seal is shaped to permit a gap between a portion of the exit of the granular tray such that granular polysilicon within the exit does not prevent a seal between the seal and the exit.

2. The valve mechanism as set forth in claim 1 wherein:
    the exit includes an opening; and
    the seal includes:
        a portion having a radius shaped to engage with the opening of the exit and having a same slope as the opening of the exit; and
        a second portion having a radius smaller than the opening of the exit and that is at least partially within the opening of the exit when the seal is in the sealed position,
        wherein the difference between the radius of the second portion and the radius of the opening of the exit defines the gap.

3. A polysilicon feed system comprising:
    a polysilicon feeder for supplying polysilicon to a growth chamber for growing a single crystal ingot from a melt;
    a magnetic pulse vibrator for vibrating the tray;
    a granular tray disposed above the vibrator, the granular tray having an exit;
    the valve mechanism as set forth in claim 1, the seal of the valve mechanism selectively obstructing the exit of the granular tray and being shaped to permit a gap between a portion of the exit of the granular tray such that granular polysilicon within the exit does not prevent a seal between the seal and the exit.

4. The polysilicon feed system as set forth in claim 3 wherein the polysilicon feeder comprises support rails for receiving the granular tray.

5. The polysilicon feed system as set forth in claim 3 wherein the granular tray is an interchangeable granular tray.

6. The polysilicon feed system as set forth in claim 5 wherein the polysilicon feeder comprises support rails for receiving the interchangeable granular tray.

7. The polysilicon feed system as set forth in claim 6 wherein the granular tray comprises:
    an exterior portion that includes an exterior channel that removably receives the support rails of the polysilicon feeder; and
    an interior profile that receives granular polysilicon from a feed material reservoir of the polysilicon feeder.

* * * * *